United States Patent [19]
Lin et al.

[11] Patent Number: 5,962,835
[45] Date of Patent: Oct. 5, 1999

[54] BOARD ADAPTER

[75] Inventors: Cheng-Hung Lin; Yu-Ming Ho, both of Taipei Hsien; Tsung-Hsi Ou Lee, Taipei; Hung-Ji Yu, Taipei Hsien, all of Taiwan

[73] Assignee: Hon Hai Precision Ind. Co., Ltd., Taipei Hsien, Taiwan

[21] Appl. No.: 08/961,750

[22] Filed: Oct. 31, 1997

[30] Foreign Application Priority Data

Dec. 13, 1996 [TW] Taiwan ................................ 8521 9426

[51] Int. Cl.⁶ ........................ G06K 07/06; H05K 07/02
[52] U.S. Cl. ........................ 235/441; 361/760; 439/48
[58] Field of Search .................................. 239/441, 486, 239/487; 361/700, 805, 748, 778; 439/71, 68; 198/617

[56] References Cited

U.S. PATENT DOCUMENTS

| | | | |
|---|---|---|---|
| 4,855,872 | 8/1989 | Wojnar et al. | 361/414 |
| 4,982,831 | 1/1991 | Irie et al. | 198/617 |
| 5,109,584 | 5/1992 | Irie et al. | 198/343.1 |
| 5,174,762 | 12/1992 | Hoppal et al. | 439/61 |
| 5,257,166 | 10/1993 | Mauri et al. | 361/760 |
| 5,667,388 | 9/1997 | Cottrell | 439/74 |

*Primary Examiner*—Le Thien Minh

[57] ABSTRACT

A board adapter for electrically connecting an electrical card connector to a mother board, comprises 68 signal holes, 100 conductive pads, a plurality of signal traces, a first grounding means, a transforming unit and a second grounding contact. The first grounding contact surrounds the signal holes and is electrically connected with a corresponding grounding contact of the electrical connector, for providing the signal holes and the electrical connector with grounding protection. The second grounding contact is alternately juxtaposed with every two of the signal traces for providing grounding protection. The conductive pads are electrically connected with either the signal traces or the grounding contacts. The transforming unit includes two power traces to separately bear two different strength voltage induced currents. When either of the traces bears a corresponding voltage induced current, the other trace can be transformed into a grounding trace to protect the bearing trace.

9 Claims, 3 Drawing Sheets

BOARD ADAPTER

BACKGROUND OF THE INVENTION

1. Field of the Invention

The present invention relates to a board adapter for electrically connecting an electrical card connector to a mother board, and particularly to a board adapter which sufficiently resists electromagnetic interference (EMI).

2. The Prior Art

A well-known, generic electrical connector is equipped with a shielding means such as a conductive shell and a grounding means connected to some grounding circuits of the mother board on which the electrical connector is mounted to resist an electromagnetic interference (EMI) and an electrostatic discharge (ESD) usually resulting from a number of high frequency electrical elements next to the connector. Such designs regarding grounding means which protect the connector can refer to the disclosures of Taiwan Patent Application Nos. 80,207,449, 81,216,447, 81,217,278, 82,205,600, 83,202,199, 83,107,162, 83,281,401, 77,208,107, 84,213,585, 84,213,586 and 85,210,940.

For an electrical card connector receiving a corresponding electrical card such as a memory card or a I/O card, a board-like adapter with a number of circuits is presently equipped to transmit Input/Output messages between the electrical card connector and the mother board. However, the board-like adapter is often exposed outside the shell means and the grounding means of the electrical card connector whereby the board-like adapter may suffer an electromagnetic interference resulting from high frequency electrical elements adjacent to the board-like adapter. In addition, another origination of the EMI problem is happened in the board-like adapter. Since some transmission traces presented on opposite surfaces of the conventional board adapter have the same polarity, adjacent transmission traces may electromagnetically interfere with each other's signal. This phenomena is commonly referred to as "crosstalking". Furthermore, the conventional board-like adapter is merely adapted to bear an unitary current, i.e. a 5 V induced current, and has no an adjustable capability to bear the variable voltages from different voltage outputs of the power supply.

Accordingly, to resolve the above disadvantages, an object of the present invention is to provide a board adapter which is designed with a transforming means consisting of a first power trace and a second power trace to separately bear two different strength voltage induced current wherein the first power trace is adapted to bear a high voltage induced current and the second power trace is adapted to bear a low voltage induced current. When the first power trace bears the high voltage current, the second power trace is transformed into a grounding trace to provide the first power trace with grounding protection, and vice versa.

Another object of the present invention is to provide a board adapter for electrically connecting an electrical card connector to a mother board, which has a first grounding means and a second grounding means for providing the signal holes, the signal traces and the electrical connector with grounding protection wherein the second grounding means consists of a plurality of grounding traces which each is alternately juxtaposed with every two of signal traces.

SUMMARY OF THE INVENTION

According to an aspect of the present invention, a board adapter for electrically connecting an electrical card connector to a mother board, comprises an obverse surface and a reverse surface wherein there are 68 signal holes defined through both of the surfaces for receiving a corresponding contact of the electrical connector. Each surface of the board adapter forms thereon 50 conductive pads, a plurality of signal traces, a first grounding means, a transforming means and a second grounding means wherein the signal traces are respectively and electrically connected with said signal holes. The first grounding mean including a plurality of grounding holes and a horizontal grounding trace surrounds the signal holes and is electrically engaged with a corresponding grounding means of the electrical connector for providing the signal holes and the electrical connector with grounding protection. The second grounding means includes a plurality of grounding traces which each is alternately juxtaposed with every two of the signal traces to provide the signal traces with grounding protection. The conductive pads are electrically connected with either the signal traces or the grounding means. The transforming means includes a first power trace and a second power trace to separately bear two different strength voltage induced currents. When either of the traces bears a corresponding voltage induced current, the other trace can be transformed into a grounding trace to protect the bearing trace.

DETAILED DESCRIPTION OF THE PREFERRED EMBODIMENTS

Figure 1A:
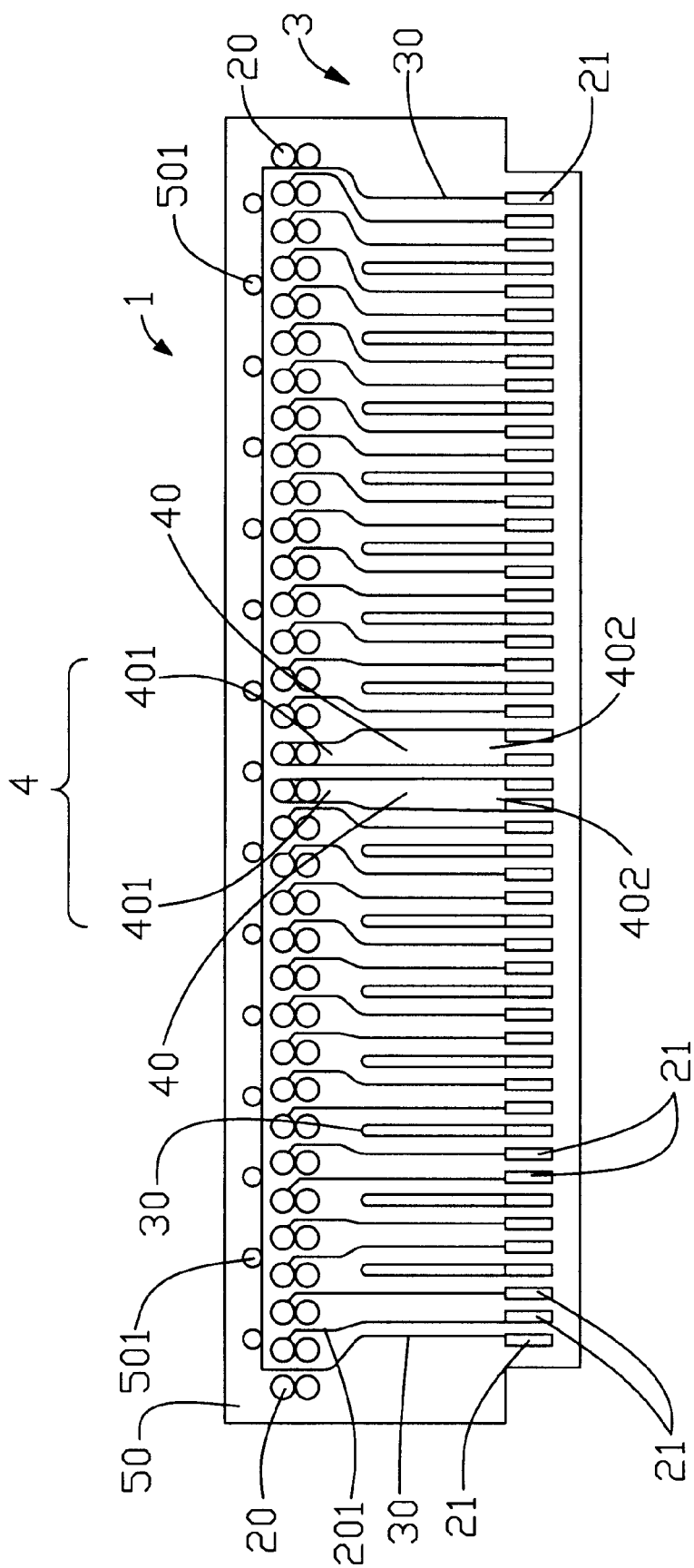
FIGS. 1A & 1B are front views of the board adapter in accordance with the present invention respectively showing an obverse surface and a reverse surface of the board adapter.
Figure 1B:
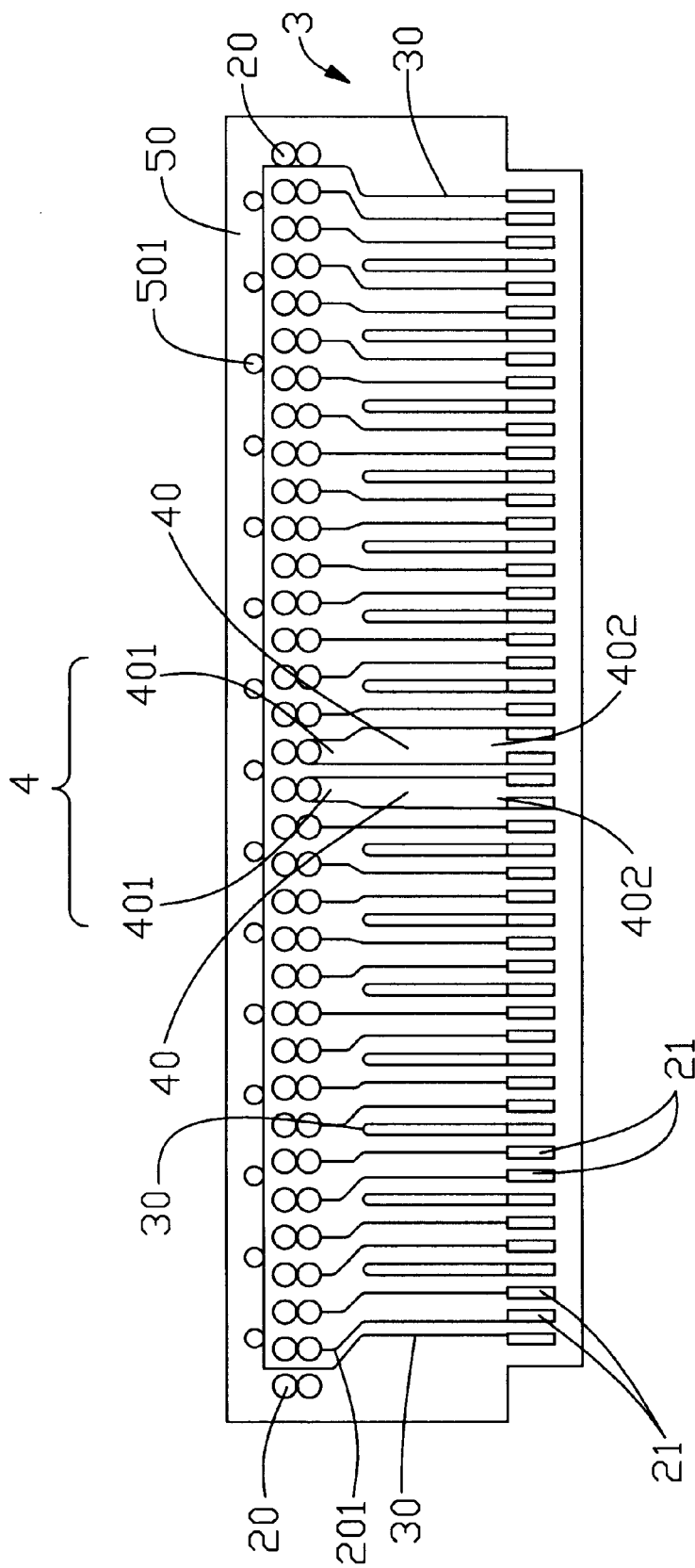

References will now be made in detail to the preferred embodiment of the invention. As shown in FIGS. 1A & 1B, a board adapter (1) for electrically transmitting input/output messages between an electrical card connector (60) (seen FIG. 2) and a mother board (not shown), includes an obverse surface and a reverse surface wherein there are 68 signal holes (20) defined through each surface. Each surface forms 50 conductive pads (21), a first grounding means (50), a transforming means (4) and a second grounding means (3) thereon.

The first grounding means (50) includes a plurality of spaced grounding holes (501), defined through both surfaces of the board adapter (1) and horizontally arranged as being the first row of holes on the top edge of the board adapter (1) for receiving a plurality of grounding terminals (not labeled in FIG. 2) of the shell of the electrical card connector, and a horizontal grounding trace serially and electrically connected with all of the grounding holes (501) for providing the electrical card connector with grounding protection.

The 68 signal holes (20), in accordance with regularization of the industrial standard of Personal Computer Memory Card International Associations (PCMCIA) are respectively labeled with serial numbers. Similarly, the 100 conductive pads (21) on both of the surfaces, in accordance with regularization of the industrial standard of PCMCIA, are also respectively labeled with code. Each serial number or code represents a specific function and describes the relationship between each signal hole (20) and the associated pad (21) as shown in tables 1 and 2 below:

TABLE 1

The obverse surface of the board adapter

| Signal Holes | Pads | Function |
|---|---|---|
| 1 | B01 | GND |
| 2 | B02 | SIG |
| 3 | B03 | SIG |
| 4 | B05 | SIG |
| 5 | B06 | SIG |
| 6 | B08 | SIG |
| 7 | B09 | SIG |
| 8 | B11 | SIG |
| 9 | B12 | SIG |
| 10 | B14 | SIG |
| 11 | B15 | SIG |
| 12 | B17 | SIG |
| 13 | B18 | SIG |
| 14 | B20 | SIG |
| 15 | B21 | SIG |
| 16 | B23 | SIG |
| 17 | B24&B25 | VCC |
| 18 | B26&B27 | VPP |
| 19 | B28 | SIG |
| 20 | B30 | SIG |
| 21 | B31 | SIG |
| 22 | B33 | SIG |
| 23 | B34 | SIG |
| 24 | B36 | SIG |
| 25 | B37 | SIG |
| 26 | B39 | SIG |
| 27 | B40 | SIG |
| 28 | B42 | SIG |
| 29 | B43 | SIG |
| 30 | B45 | SIG |
| 31 | B46 | SIG |
| 32 | B48 | SIG |
| 33 | B49 | SIG |
| 34 | B50 | GND |

TABLE 2

The reverse surface of the board adapter

| Signal Holes | Pads | Function |
|---|---|---|
| 35 | B51 | GND |
| 36 | B52 | SIG |
| 37 | B53 | SIG |
| 38 | B55 | SIG |
| 39 | B56 | SIG |
| 40 | B58 | SIG |
| 41 | B59 | SIG |
| 42 | B61 | SIG |
| 43 | B62 | SIG |
| 44 | B64 | SIG |
| 45 | B65 | SIG |
| 46 | B67 | SIG |
| 47 | B68 | SIG |
| 48 | B70 | SIG |
| 49 | B71 | SIG |
| 50 | B73 | SIG |
| 51 | B74&B75 | VCC |
| 52 | B76&B77 | VPP |
| 53 | B78 | SIG |
| 54 | B80 | SIG |
| 55 | B81 | SIG |
| 56 | B83 | SIG |
| 57 | B84 | SIG |
| 58 | B86 | SIG |
| 59 | B87 | SIG |
| 60 | B89 | SIG |
| 61 | B90 | SIG |
| 62 | B92 | SIG |
| 63 | B93 | SIG |
| 64 | B95 | SIG |
| 65 | B96 | SIG |

TABLE 2-continued

The reverse surface of the board adapter

| Signal Holes | Pads | Function |
|---|---|---|
| 66 | B98 | SIG |
| 67 | B99 | SIG |
| 68 | B100 | GND |

The table 1 corresponds with FIG. 1A wherein the serial Nos. 1–34 are successively labeled from the first signal holes (20) of the second row of holes at the left corner of the obverse surface of the board adapter (1) to the thirty-fourth signal hole (20) located at the far right end of the second row of holes at the right corner of the obverse surface of the board adapter (1), and wherein the signal holes (20) labeled with serial Nos. 2–33 are respectively and electrically connected to the corresponding conductive pads (21) on the obverse surface of the board adapter (1) by means of a number of signal traces (201).

Figure 2:
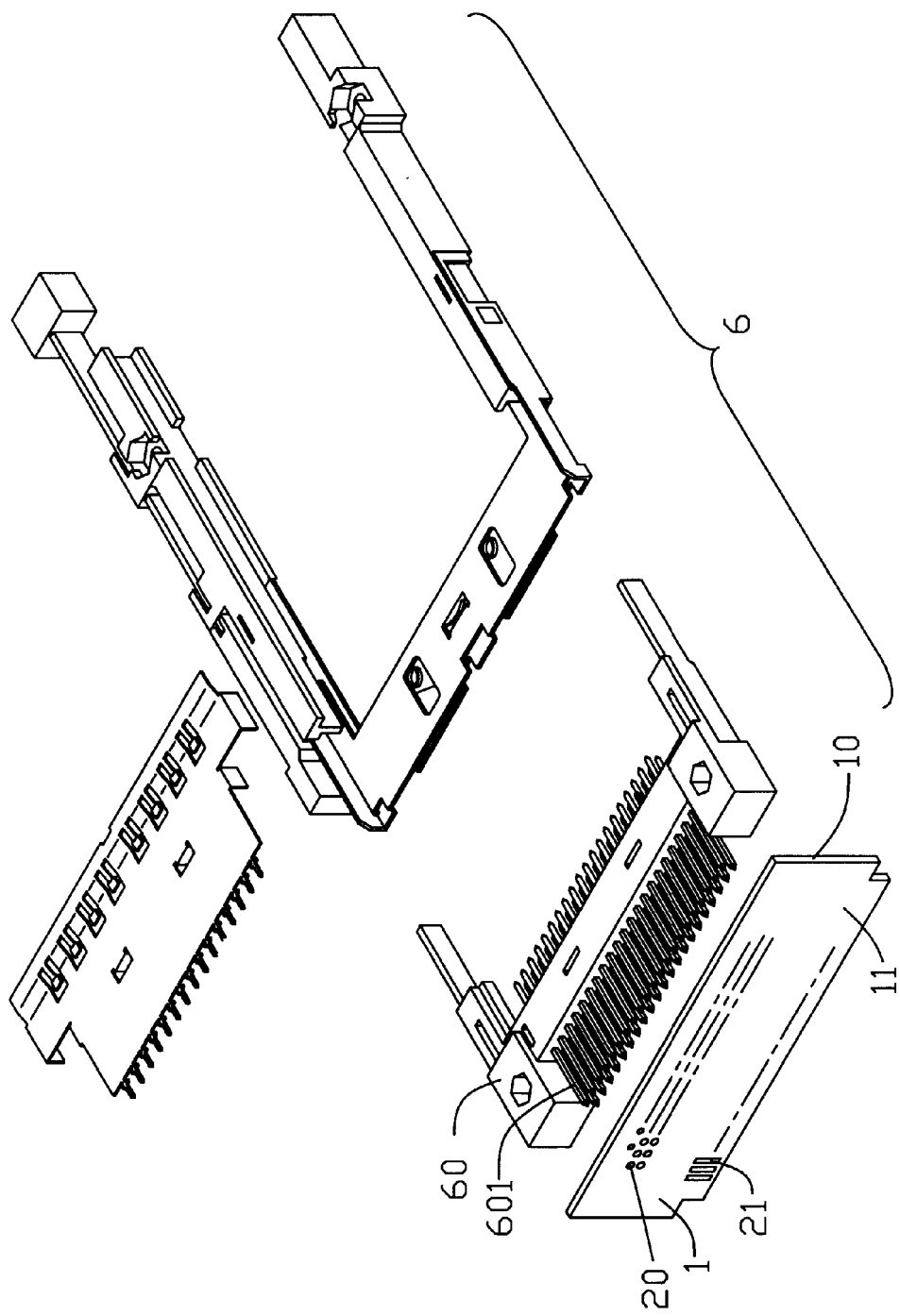
FIG. 2 is a perspective view of the board adapter in accordance with the present invention showing the board adapter which is separated form an electrical card connector.

Similarly, table 2 corresponds with FIG. 1B wherein the serial Nos. 35–68 are successively labeled from the first signal hole (20) of the third row of holes at the left corner of the reverse surface of the board adapter (1) to the thirty-fourth signal hole (20) located at the right end of the third row of holes at the right corner of the reverse surface of the board adapter (1) wherein the signal holes (20) labeled with serial Nos. 36–67 are respectively and electrically connected to the corresponding conductive pads (21) on the reverse surface of the board adapter (1) by means of the other signal traces (201). The two rows of the signal holes (20) labeled with serial Nos. 1–68 are used to respectively receive two rows of corresponding contacts (601) of the electrical card connector (60) as shown in FIG. 2.

The second grounding means (3) consists of a plurality of grounding traces (30) wherein each grounding trace (30) is alternately juxtaposed with every two of the signal traces (201) to configure a grounding protection for the adjacent signal traces (201) and is electrically connected with a corresponding pad (21). In addition, the far left grounding trace (30) and the far right grounding trace (30) on the obverse surface of the board adapter (1) are respectively and electrically connected to opposite ends of the horizontal grounding trace of said first grounding means (50) wherein the far right grounding trace (30) is further serially and electrically connected with the signal holes (20) with serial Nos. 34 & 68. Likewise, on the reverse surface of the board adapter, the far left grounding trace (30) and the far right grounding trace (30) are respectively and electrically connected to opposite ends of the horizontal grounding trace of said first grounding means (50) wherein the far right grounding trace (30) is further serially and electrically connected with the signal holes (20) with serial Nos. 1 & 35. Therefore, the horizontal grounding traces of said first grounding means (50) and the second grounding means (3) surround the signal traces (201) and the signal holes (20) thereby providing grounding protection.

The conductive pads (21) with codes Nos. 1–100 are arranged on both of the surface of board adapter (1) wherein the conductive pads (21) with codes Nos. 1–50 are successively labeled from the first pad (21) at the left corner, bottom edge of the obverse surface of the board adapter (1) to the fiftieth pad (21) located at the right corner, bottom edge of the obverse surface of the board adapter (1). The conductive pads (21) with codes Nos. 51–100 are successively labeled from the first pad (21) at the left corner, bottom edge of the reverse surface of the board adapter (1) to the fiftieth pad (21) located at the right corner, bottom edge of the reverse surface of the board adapter (1). All of the conductive pads (21) are electrically connected with either corresponding signal traces (201) or grounding traces (30), and are used to electrically engage with corresponding contacts of an edge card connector (not shown) which is mounted on the mother board when the board adapter (1) is inserted within said edge card connector.

The transforming means (4) consists of a first power trace (40A) and a second power trace (40B) on each surface of the board adapter (1). On the obverse surface of the board adapter (1) shown in FIG. 1A, one end (401A) of first power trace (40A) is electrically connected with the signal hole (20) with serial No. 17 and an opposite end (402A) thereof is electrically connected with the conductive pads (21) with codes Nos. 24 & 25 wherein the first power trace (40A) is adapted to bear a high voltage induced current such as 12V. One end (401B) of second power trace (40B) is electrically connected with the signal hole (20) with serial No. 18 and an opposite end (402B) thereof is electrically connected with the conductive pads (21) with codes Nos. 26 & 27 wherein the second power trace (40B) is adapted to bear a low voltage induced current such as 5V.

Similarly, on the reverse surface of the board adapter (1) shown in FIG. 1B, one end (401A) of first power trace (40A) is electrically connected with the signal hole (20) with serial No. 51 and an opposite end (402A) thereof is electrically connected with the conductive pads (21) with codes Nos. 74 & 75 wherein the first power trace (40A) is adapted to bear a high voltage induced current such as 12V. One end (401B) of second power trace (40B) is electrically connected with the signal hole (20) with serial No. 52 and an opposite end (402B) thereof is electrically connected with the conductive pads (21) with codes Nos. 76 & 77 wherein the second power trace (40B) is adapted to bear a low voltage induced current such as 5V.

The transforming means (4) enables the board adapter (1) to separately bear a low voltage or a high voltage induced current from different strength outputs of the power supply (not shown) as shown in FIG. 2. However, when the first power trace (40) is used to bear a high voltage induced current, the second power trace (40B) located on the same surface is transformed into a grounding trace to provide the first power trace (40A) with grounding protection, and vice versa.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims.

We claim:

1. A board adapter for electrically connecting an electrical connector onto a mother board, comprising:

a signal means including a plurality of signal traces for electrically engaging with a plurality of contacts of the electrical connector;

a grounding means surrounding the signal means to provide grounding protection;

a plurality of conductive pads electrically connected with either the signal means or the grounding means; and a transforming means including at least two traces to separately bear two different strength voltage currents wherein when either of the traces bears a corresponding voltage induced current, the other trace is transformed into a grounding trace to protect the bearing trace.

2. The board adapter assembly as described in claim 1, wherein said signal means further includes a plurality of signal holes defined through opposite surfaces of the board adapter for respectively receiving the contacts of the electrical connector.

3. The board adapter as described in claim 2, wherein said signal traces are respectively and electrically connected with the signal holes.

4. A board adapter for electrically connecting an electrical connector onto a mother board, comprising:

a plurality of signal holes defined through opposite surfaces of the board adapter for receiving a plurality of contacts of the electrical connector;

a plurality of signal traces respectively and electrically connected with said signal holes;

a first grounding means surrounding the signal holes and electrically connected with a corresponding grounding means of the electrical connector for providing the signal holes and the electrical connector with grounding protection;

a second grounding means alternately arranged with the signal traces for providing the signal traces with grounding protection;

a plurality of conductive pads electrically connected with either the signal traces or the grounding means.

5. The board adapter as described in claim 4, wherein said first grounding means defines a plurality of grounding holes for receiving a corresponding grounding means of the electrical connector, and a horizontal grounding trace serially and electrically connected with said grounding holes.

6. The board adapter as described in claim 4, wherein said second grounding means includes a plurality of grounding traces.

7. The board adapter as described in claim 6, wherein each grounding trace is alternately juxtaposed with every two of the signal traces to provide the adjacent signal traces with grounding protection.

8. A board adapter for electrically connecting an electrical connector unto a mother board, comprising:

signal means including a plurality of signal traces for electrically engaging with a plurality of contacts of the electrical connector;

grounding means including a plurality of grounding traces each juxtaposed with every two signal traces, alternately;

a plurality of conductive pads positioned along a bottom edge portion of the board adapter wherein each of said pads is connected to one of either signal means or signal means.

9. The board adapter as defined in claim 8, wherein transforming means is provided therewith and defines a pair of power traces each connecting two conductive pads to a corresponding signal hole.

* * * * *